US010726930B2

(12) United States Patent
Sarkar et al.

(10) Patent No.: US 10,726,930 B2
(45) Date of Patent: Jul. 28, 2020

(54) METHOD AND SYSTEM FOR A STORAGE (SSD) DRIVE-LEVEL FAILURE AND HEALTH PREDICTION LEVERAGING MACHINE LEARNING ON INTERNAL PARAMETRIC DATA

(71) Applicant: Western Digital Technologies, Inc., San Jose, CA (US)

(72) Inventors: Jay Sarkar, San Jose, CA (US); Cory Peterson, Rochester, MI (US); Amir Sanayei, San Jose, CA (US); Vidyabhushan Mohan, San Jose, CA (US); Yao Zhang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 38 days.

(21) Appl. No.: 15/979,348

(22) Filed: May 14, 2018

(65) Prior Publication Data

US 2019/0108888 A1  Apr. 11, 2019

Related U.S. Application Data

(60) Provisional application No. 62/569,406, filed on Oct. 6, 2017.

(51) Int. Cl.
*G11C 16/34* (2006.01)
*G06F 12/02* (2006.01)
(Continued)

(52) U.S. Cl.
CPC .......... *G11C 16/349* (2013.01); *G06F 3/0616* (2013.01); *G06F 3/0619* (2013.01);
(Continued)

(58) Field of Classification Search
None
See application file for complete search history.

(56) References Cited

U.S. PATENT DOCUMENTS 8,639,971 B1 * 1/2014 White ................. G06F 11/0709
                                                707/687
9,542,296 B1 * 1/2017 Engers ............... G06F 11/3452
(Continued)

OTHER PUBLICATIONS

Mielke et al., "Reliability of Solid-State Drives Based on NAND Flash Memory," Proceedigns of the IEEE, vol. 105, No. 9, Sep. 2017, pp. 1725-1750.

*Primary Examiner* — Sean D Rossiter
*Assistant Examiner* — Stephanie Wu
(74) *Attorney, Agent, or Firm* — Morgan, Lewis & Bockius LLP

(57) ABSTRACT

Systems and methods for solid-state storage drive-level failure prediction and health metric are described. A plurality of host-write commands are received at a solid-state storage device. A number of drive-writes per day based on the on the plurality of host-write commands is determined. An aggregated amount of degradation to one or more internal non-volatile memory components based on the number of drive-writes per day is determined. Using a machine-learned model, a probability of failure value based on a set of parameter data and the aggregated amount of degradation to the non-volatile memory component is generated. An alert is generated, based on the probability of failure value or degradation threshold.

20 Claims, 3 Drawing Sheets

(51) Int. Cl.
*G11C 29/52* (2006.01)
*G06N 7/00* (2006.01)
*G06F 3/06* (2006.01)
*G06N 5/04* (2006.01)
*G11C 29/04* (2006.01)

(52) U.S. Cl.
CPC ........ *G06F 3/0679* (2013.01); *G06F 12/0246* (2013.01); *G06N 5/04* (2013.01); *G06N 7/005* (2013.01); *G11C 29/52* (2013.01); *G11C 2029/0401* (2013.01)

(56) References Cited

U.S. PATENT DOCUMENTS

| | | | | |
|---|---|---|---|---|
| 9,747,057 | B1* | 8/2017 | Ramani | H04N 21/4335 |
| 10,157,105 | B2* | 12/2018 | Chen | G06F 11/1451 |
| 10,216,558 | B1* | 2/2019 | Gaber | G06F 11/0727 |
| 2013/0142024 | A1* | 6/2013 | Sanvido | G11B 27/36 369/53.41 |
| 2014/0189404 | A1* | 7/2014 | Sur | G06F 1/3234 713/323 |
| 2015/0026449 | A1* | 1/2015 | Heo | G06F 12/0246 713/2 |
| 2015/0046664 | A1* | 2/2015 | Fitzpatrick | G06F 3/0616 711/156 |
| 2016/0034206 | A1* | 2/2016 | Ryan | G11C 16/349 711/103 |
| 2016/0034394 | A1* | 2/2016 | McKean | G06F 12/0806 709/217 |
| 2017/0083463 | A1* | 3/2017 | Kachare | G06F 13/4282 |
| 2017/0177222 | A1* | 6/2017 | Singh | G06F 3/061 |
| 2017/0185904 | A1* | 6/2017 | Padmanabhan | G06F 16/00 |
| 2018/0239540 | A1* | 8/2018 | Kachare | G06F 3/0611 |
| 2019/0042089 | A1* | 2/2019 | Chagam Reddy | G06F 3/0604 |
| 2019/0042126 | A1* | 2/2019 | Sen | G06F 9/28 |
| 2019/0138415 | A1* | 5/2019 | Chen | G06F 11/3034 |
| 2019/0198063 | A1* | 6/2019 | Tsuruya | G11C 16/349 |
| 2019/0205193 | A1* | 7/2019 | Wu | G06F 11/008 |
| 2019/0243567 | A1* | 8/2019 | Kankani | G06F 3/0605 |

* cited by examiner

METHOD AND SYSTEM FOR A STORAGE (SSD) DRIVE-LEVEL FAILURE AND HEALTH PREDICTION LEVERAGING MACHINE LEARNING ON INTERNAL PARAMETRIC DATA

CROSS-REFERENCE TO RELATED APPLICATIONS

This application claims the benefit of under 35 U.S.C. § 119(e) of U.S. Provisional Application No. 62/569,406 titled "SOLID-STATE STORAGE DRIVE-LEVEL FAILURE PREDICTION" and filed on Oct. 6, 2017, which is hereby incorporated by reference herein.

BACKGROUND

With the significant growth in the amount of data being stored in data storage systems and criticality of the data, reliability of the data storage systems is crucial. For the reliability of the data storage systems, customers typically rely on the warranties provided by the manufacturers of the data storage systems that specify certain performance metrics and a lifetime of the data storage system.

However, these performance metrics and lifetime warranties cannot be completely relied upon if the amount of data being written to the data storage systems and the frequency of the writes exceeds the specifications upon which the performance metrics and lifetime of the data storage systems are warrantied. Exceeding these specifications increases the likelihood of the data storage systems failing, and worse, places the critical data stored on these data storage systems by customers at risk.

SUMMARY

At least one aspect is directed to a solid-state storage device. The solid-state storage device includes a controller, and a non-volatile memory (NVM) device. The controller receives one or more host-write commands. The controller calculates, based on the one or more host-write commands, a number of drive-writes per day. The controller calculates, based on the number of drive-writes per day, an aggregated amount of degradation to a non-volatile memory component. The controller generates, using a machine-learned model, a probability of failure value based on data associated with one or more input parameters to the machine-learned model and the aggregated amount of degradation to the non-volatile memory component. The controller generates, based on the probability of failure value, an alert from an individual drive.

At least one aspect is directed to a computer-implemented method. The method includes receiving one or more host-write commands at a solid-state storage device. The method includes calculating, based on the one or more host-write commands, a number of drive-writes per day. The method includes calculating, based on the number of drive-writes per day, an aggregated amount of degradation to any or all non-volatile memory components. The method includes generating, using a machine-learned model, a probability of failure value based on data associated with one or more input parameters to the machine-learned model and the aggregated amount of degradation to the non-volatile memory component. The method includes generating, based on the probability of failure value, an alert from an individual drive.

At least one aspect is directed to a solid-state storage device including a non-volatile memory component. The solid-state storage device includes means for receiving one or more host-write commands at a solid-state storage device. The solid-state storage device includes means for calculating, based on the one or more host-write commands, a number of drive-writes per day. The solid-state storage device includes means for calculating, based on the number of drive-writes per day, an aggregated amount of degradation to the non-volatile memory component. The solid-state storage device includes means for generating, using a machine-learned model, a probability of failure value based on data associated with one or more input parameters to the machine-learned model and the aggregated amount of degradation to the non-volatile memory component, and means for generating, based on the probability of failure value, an alert.

DETAILED DESCRIPTION

The detailed description set forth below is intended as a description of various configurations of the subject disclosure and is not intended to represent the only configurations in which the subject disclosure may be practiced. The appended drawings are incorporated herein and constitute a part of the detailed description. The detailed description includes specific details for the purpose of providing a thorough understanding of the subject disclosure. However, it will be apparent to those skilled in the art that the subject disclosure may be practiced without these specific details. In some instances, structures and components are shown in block diagram form in order to avoid obscuring the concepts of the subject disclosure. Like components are labeled with identical element numbers for ease of understanding.

The subject technology is directed to the prediction of failure or other operational degradation (such as latency degradation) of a solid-state storage drive. As discussed in detail below, the subject technology uses a machine-learned model to generate a probability of failure of a solid-state storage drive and generate an alert if the probability of failure satisfies a threshold probability of failure. The inputs to the machine-learned model include, but are not limited to, various solid-state storage drive parameter data and a throughput acceleration coefficient based on an actual of number of drive-writes per day of the solid-state storage drive and a predetermined number of drive-writes per day that the solid-state storage drive is designed to withstand.

Figure 1:
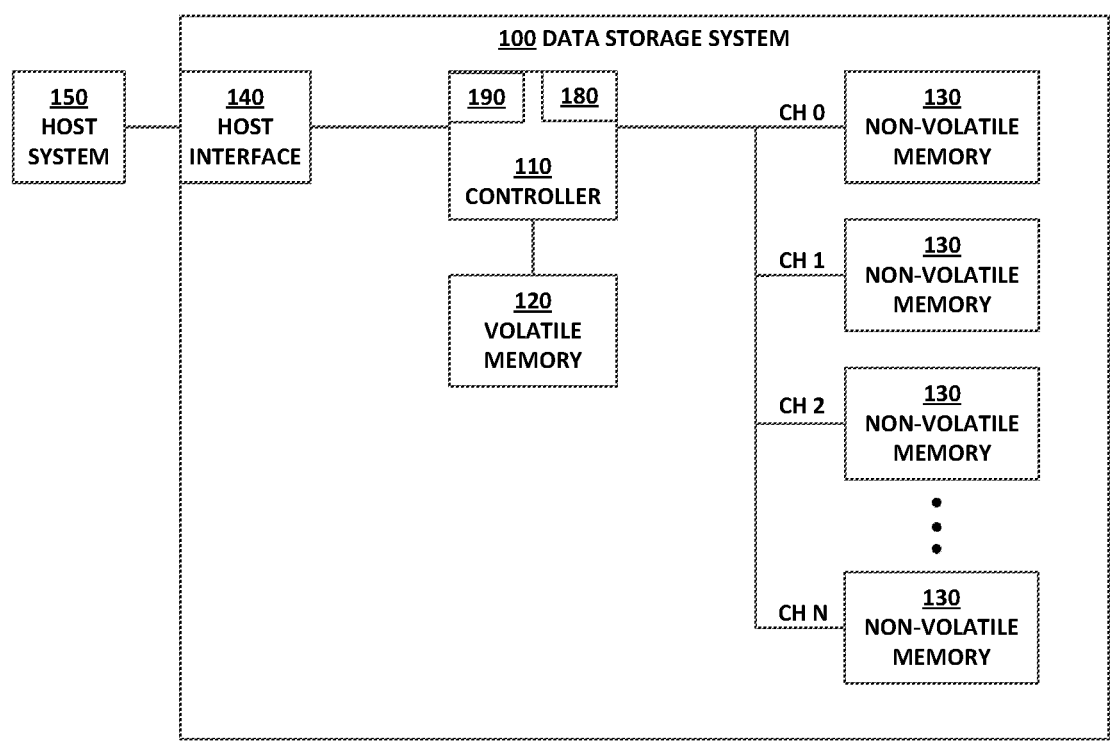
FIG. 1 is a block diagram illustrating components of a data storage system according to aspects of the subject technology.

FIG. 1 is a block diagram illustrating components of a data storage system 100 according to aspects of the subject technology. Data storage system 100 may be an enterprise solid-state storage drive (SSD), hyperscale SSD, data-center SSD, consumer SSD and the like. Data storage system 100 may be included in an enterprise storage environment. As depicted in FIG. 1, data storage system 100 includes controller 110, volatile memory 120, non-volatile memory 130, host interface 140, machine-learned module 180, and comparison module 190. Controller 110 is configured to process requests received from host system 150 via host interface 140 to access data in non-volatile memory 130. The data access requests received from host system 150 may include write requests to store host data in non-volatile memory 130, read requests to retrieve host data stored in non-volatile memory 130, and erase requests to erase host data stored in non-volatile memory 130. Other types of requests, such as status requests or device management requests, may be received from host system 150 and processed by controller 110.

Host interface 140 is configured to couple host system 150 to data storage system 100. Host interface 140 may include electrical and physical connections for operably coupling host system 150 to controller 110. Via the electrical and physical connections, host interface 140 is configured to communicate data, addresses, and control signals between host system 150 and controller 110. Controller 110 is configured to store host data received from host system 150 in non-volatile memory 130 in response to a write request received from host system 150, and to read host data stored in non-volatile memory 130 and to transfer the read host data to host system 150 via host interface 140 in response to a read request received from host system 150.

Host interface 140 may implement standard interfaces including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS), Ethernet based storage interfaces, Peripheral Component Interconnect Express (PCIe), NVM Express (NVMe), NVM Express over Fabrics, NVDIMM-based Persistent (Storage-Class) Memory interfaces, and the like. However, the subject technology is not limited to the use of standard interfaces and may utilize custom or proprietary interfaces for communications with host system 150.

Host system 150 represents any device configured to be coupled to and communicate with data storage system 100 via host interface 140 to store and retrieve data in data storage system 100. Host system 150 may be a computing device such as a server, a personal computer, a workstation, a laptop computer, a smart phone, Flash Array and the like. Alternatively, host system 150 may be an electronic device such as a digital camera, a digital audio player, a digital video recorder, and the like. Host system 150 may be a computing device communicatively coupled to other computing devices that are part of a computer network, such as a storage-area network (SAN).

Controller 110 is configured to monitor and control the operation of components of data storage system 100 in response to requests received from host system 150 and during execution of internal maintenance operations. Controller 110 may include a multi-core processor, a general-purpose microprocessor, a microcontroller, a digital signal processor (DSP), an application specific integrated circuit (ASIC), a field programmable gate array (FPGA), a programmable logic device (PLD), a state machine, gated logic, discrete hardware components, or a combination of the foregoing. In some aspects, one or more components of controller 110 may be integrated into a single chip or module, or may be implemented in two or more discrete chips or modules.

Controller 110 may include a decoder for decoding raw data read from non-volatile memory 130 and an encoder to encode data prior to storage in non-volatile memory 130. The encoder and decoder are not limited to any particular error-correcting code (ECC) algorithm. For example, a low-density parity-check code may be used to encode and decode data within data storage system 100. Controller 110 may include multiple instances of encoder and decoders, some of which may be dedicated to soft decoding processes while others to hard decoding processes. Controller 110 also may include an address translation manager to manage the translation of host addresses used by host system 150 to physical addresses of the blocks, wordlines and pages within non-volatile memory 130. Other components may include scramblers, descramblers, maintenance managers (e.g., garbage collection, wear leveling, data relocation, etc.).

The components of controller 110 each may be implemented using one or more sequences of instructions (e.g., software/firmware) loaded and executed by a processor or processor core, using hardware logic circuits, or a combination of hardware and software/firmware. For example, in a controller that includes multiple processors or a multi-core processor, individual processors or processor cores may be assigned to provide the functionality of respective components of controller 110. Furthermore, one or more of the components discussed above may be implemented outside of controller 110 without departing from the scope of the subject technology.

Volatile memory 120 represents memory used by controller 110 to temporarily store data and information used to manage data storage system 100. For example, controller 110 may use volatile memory 120 as buffers for host data waiting to be written to non-volatile memory 130 or host data read from non-volatile memory 130 waiting to be transferred to host system 150 or written back to non-volatile memory 130. Controller 110 also may store various types of system data used in the management of data storage system 100 in volatile memory 120. The system data may include tables mapping logical addresses referenced by host system 150 to physical addresses of non-volatile memory 130, program/erase (P/E) cycle counts, error statistics, valid/invalid data counts, etc. Controller 110 may store some or all of the data and information described above in non-volatile memory 130, or another form of non-volatile memory not shown, so as to preserve the data and information when data storage system 100 is shut down or otherwise loses power. Controller 110 may periodically store copies of the data and information in non-volatile memory 130 or may wait for a shutdown or power-loss event to back up the data and information in non-volatile memory 130. Controller 110 may periodically store copies of data related to the input parameters to the machine-learned module 180, such as data related to non-volatile memory 130 management and defect detection parameters data and data storage system 100 operational parameters data.

Volatile memory 120 may be a random-access memory (RAM) such as static RAM (SRAM) or dynamic RAM (DRAM). However, the subject technology is not limited to any particular type of RAM. In addition, volatile memory 120 may be implemented using a single RAM module or multiple RAM modules. While volatile memory 120 is depicted as being distinct from controller 110, portions or all of volatile memory 120 may be incorporated into controller 110.

As depicted in FIG. 1, multiple non-volatile memory devices 130 are arranged in multiple channels. For example, FIG. 1 illustrates each of N channels having one non-volatile memory device 130. Each of the non-volatile memory devices 130 may include a single die or multiple die. Each die may include an array of non-volatile memory cells, such as NAND flash, Phase Change or MRAM memory cells, where each cell may be used to store one or more bits of data. For purposes of this description, the flash memory cells are configured to store three bits of data per cell in a triple-level cell (TLC) configuration. However, the subject technology is not limited to this configuration and may be implemented in systems configured to store two bits of data per cell in a multi-level cell (MLC) configuration, four bits per cell in a quad-level cell (QLC) configuration, etc. Each of the non-volatile memory devices 130 may be implemented in respective chips or packages. While each channel is depicted as having a single non-volatile memory device 130, the subject technology may include implementations in which each channel includes two or more non-volatile memory devices 130. The non-volatile memory devices may also be based on Phase Change or MRAM/STT-RAM technology.

The flash memory cells of a die may be arranged in physical blocks, with each block containing multiple wordlines. Each wordline includes a number of memory cells (e.g., 1 k, 2 k, 4 k, etc.). Depending on the number of bits stored per cell, multiple pages of data may be stored in each wordline. For example, in TLC flash memory three pages of data may be stored in each wordline. The subject technology is not limited to any particular number of wordlines in each physical block. For example, each block may contain 8 wordlines, 16 wordlines, 32 wordlines, etc. Furthermore, the number of physical blocks contained in each flash memory die is not limited to any particular number. In NAND flash memory, the page of a wordline, or the wordline as a whole, represents the smallest unit available for writing data to the flash memory die or reading data from the flash memory die. Physical blocks represent the smallest unit available for erasing data in the flash memory die. The method described is not constrained by specific physical layout of data on the NVM. As such, bit-alterable NVM technologies, including Phase Change and MRAM, are also covered by the described method.

Controller 110 is configured to communicate commands, control information, addresses, data, etc. with the flash memory die via the respective flash memory channels 0-N. Each channel may represent one or more buses configured to communicate electrical signals encoded with commands, control information, addresses, and/or data between controller 110 and the flash memory die coupled to the respective NVM channel. The subject technology is not limited to any particular number of flash memory channels. For example, data storage system 100 may include 8 channels, 16 channels, 32 channels, etc., without departing from the scope of the subject technology.

Controller 110 may include a machine-learned module 180, which implements a machine-learned model trained to generate an impending probability of failure value based on input data provided to machine-learned module 180. The machine-learned model is trained using training data gathered from a population of data storage systems. The population of data storage systems included data storage systems that failed and data storage systems that did not fail. The training data includes data related to a set of input parameters from data storage systems of the population from the first time stress is applied to those data storage systems until the data storage system failed or until a predetermined period of time for collecting such data expired. For example, data for the set of input parameters includes data from the first time data is written to those data storage systems and until one year from the first time or until the data storage system failed. The training data includes data related to the failure point of any data storage system that failed.

The input parameters to the machine-learned model of the machine-learned module 180 are parameters related to various non-volatile memory 130 management and defect detection parameters and data storage system operational parameters. These parameters may include hardware defect parameters, for example, block-level failure patterns in a non-volatile memory component, or other hardware defects that may be part of a fault calculation, such as a bit error rate. These input parameters also may include parameters related to a data storage system's hardware and firmware. These input parameters include parameters that identify hardware defects and failures, and output data from proactive and/or reactive firmware algorithms that are configured to assist with normal operation of a data storage system. In one or more implementations, a proactive firmware algorithm is an algorithm that outputs data, which assists a controller of a data storage system to perform normal operations of a data storage system. Examples of such output data include, but are not limited to, wear-leveling information related to the non-volatile memory devices of the data storage system. In one or more implementations, a reactive firmware algorithm is an algorithm that outputs data, which is utilized by a controller of a data storage system to assist in recovering from a defect of a non-volatile memory device of the data storage system. Examples of such output data include, but are not limited to, data related block-level data recovery of a non-volatile memory device.

Examples of such non-volatile memory management and defect detection parameter data include, but are not limited to, non-volatile memory translation layer management events data, controller initiated data movement for non-volatile memory endurance management event data, non-volatile memory translation layer data caching management event data, non-volatile memory page, block and die-level defect density data, non-volatile memory read, program and erase failure defect density data, non-volatile memory page level defect management data, non-volatile memory translation layer backup event data, controller initiated background data movement in non-volatile memory event data, controller initiated background data movement in non-volatile memory for proactively managing page, block, and die-level degradation data, controller initiated data movement in non-volatile memory for reactively managing program and erase failures event data, controller initiated data movement in non-volatile memory for managing defragmentation of the non-volatile memory event data, controller initiated user data cache backup for power loss management events data, non-volatile memory re-read methods event data, controller managed available non-volatile memory 130 writable space data, non-volatile memory raw bit error rate data, controller initiated non-volatile memory erase or rewrite operation management data, controller initiated defect management by redundant array of independent disks (RAID) rebuild for page, block, or die-level failures data, controller initiated event for non-volatile memory data movement and correction in response to errors data.

The data storage system 100 can include multiple sensors. Examples of such sensors include, but are not limited to, temperature sensors and the like. One or more of the sensors are configured to transmit data captured by the sensors to the controller 110. The controller 110 is configured to receive the data from the sensors and, based on the data from the sensors, perform operations. In some implementation, the sensor data can be selected as one or more input parameters to the machine-learned model of the machine-learned module 180, and data from the sensors is transmitted to the machine learned module 180 as input data for the sensors selected as input parameters to the machine-learned model.

The machine-learned model of the machine-learned module 180 is trained using the parameter data of data storage systems that failed and survived in order for the machine-learned model to learn to identify various combinations of its input parameter values that can result in a failure of a data storage system. By learning to identify combinations of parameter values that can result in a failure of a data storage system, the machine-learned model is configured to classify a data storage system as either a failing or failed data storage system or a surviving data storage system. The machine-learned model, in identifying parameter values that can result in a failure of data storage system, is configured to rank the different parameters relevant to each other and predict the likelihood of a data storage system failing based on the values of the ranked parameters. In some implementations, the machine-learned model is configured generate and/or modify a set of weights that can be applied to different input parameter values based on the ranking of the different parameters.

The machine-learned model of the machine-learned module 180 is further trained to predict whether a data storage system will fail or not fail using a set of data of the selected input parameters different from the set of data utilized for learning to identify parameter values that can result in a failure of data storage system. Such data is referred to herein as "unseen data set." This unseen data set is data from data storage systems of the population of data storage systems that were not previously utilized by the machine-learned model in training itself to identify one or more combinations of parameter values that can result in a failure of a data storage system. In some implementations, in training the machine-learned model to predict whether a data storage system will fail or not fail, the unseen data set is provided to the machine-learned model in the same order of time as the data was generated. For example, the unseen data set is provided starting from the first instance of time that such data was generated until the last instance of time that data for such parameters were generated.

In some implementations, the trained machine-learned model of the machine-learned module 180 is implemented as a module in the firmware of the data storage system 100. In some implementations, during the running of the data storage system 100, one or more sub-components (not shown) of the controller 110 can be configured to provide or transfer data of input parameters to the machine-learned model of the machine-learned module 180 as inputs. Data of selected parameters is provided to the machine-learned model in real-time or near real-time. The machine-learned model, based on the data of the selected parameters provided as inputs, determines, in real-time or near real-time, whether the data storage system 100 is likely to fail or not fail. Thus, the machine-trained model is evaluating the health of the data storage system 100 while the data storage system is operating and may be undergoing stress, and predicting whether the data storage system 100 will fail or not fail.

The machine-learned model of the machine-learned module 180 is configured to generate an impending probability of failure value or score in determining whether a data storage system will fail or not. In some implementations, the machine-learned model is configured to transmit the probability of failure value to the comparison module 190. The comparison module 190 is configured to determine whether the probability of failure value satisfies a threshold probability of failure value. The comparison module 190 is configured to output a signal that indicates whether the probability of failure value satisfies the threshold value. For example, the comparison module 190 can output a high bit or "1" when the probability of failure value satisfies the threshold probability of value. The controller 110 is configured to generate an alert in response to the comparison module 190 determining that the probability of failure value satisfies a threshold probability of failure value and transmits the alert to the host system. The host system of the data storage system 100, such as the host system 150, can be configured to perform one or more operations in response to receiving the alert. Examples of such operations include, but are not limited to, reducing the number of writes to that specific data storage system that generated the alert, and not writing to that specific data storage system. In some implementations, the comparison module 190 can be a sub-module within the machine-learned module 180.

The alert generated by the controller 110 can be a binary alert, such as a high bit indicating that the data storage system of that controller is likely to fail in the near future. In some implementations, the alert generated can be a probabilistic value alert, which indicates a level of probability of failure value, and the host system 150 can perform one or more operations based on the level of the probability of failure value. For example, if the threshold probability of failure value was set to be 60% and the probability of failure value is 70%, then the host system 150 can be configured to perform different operations at a probability of failure value at 70%, than when the probability of failure value is 90%. Examples of such operations include, but are not limited to, the host system 150 writing to the data storage system 100 less frequently if the probability of failure value is at 70%, and not writing to the data storage system 100 at all if the probability of failure value is at 90%. Such an ability to predict the failure of the data storage system 100 allows the host system 150 of the data storage system 100 to act proactively to a potential failure or degradation of the data storage system 100, rather than reacting that the data storage system 100 has failed.

The machine-learned model of the machine-learned module 180 is also configured to accept as an input parameter, a parameter that indicates an aggregated amount of damage or degradation of the non-volatile memory 130 blocks of the data storage system 100. An example of such a parameter can be the average value of drive writes per day of the data storage system 100, the value of which indicates the units of drive-capacities worth of data that the data storage system 100 is written to, averaged per unit time, from the first time the data storage system was powered on until the current day. In some implementations, the controller 110 is configured to determine a throughput acceleration coefficient (TAC) based on the following:

$$TAC = \frac{\text{Number of host driven drive-writes per day}}{\text{Drive-writes per day specification}} \quad (1)$$

The controller 110 determines the number of drive-writes per day for data storage system 100 based on the number of write commands received from host system 150, total amount of the written data and the data-storage capacity of the storage system. Drive-writes per day specification for data storage system 100 is a pre-determined number of drive writes per day that the data storage system 100 is designed to handle in order for the data storage system 100 to operate for a specific period of time. The drive-writes per day specification data is stored in storage unit communicatively coupled to controller 110. Controller 110 provides the throughput acceleration coefficient to machine-learned module 180.

In some implementations, controller 110 may determine the throughput acceleration coefficient over multiple periods of time. In some implementations, controller 110 may determine a statistical measurement of throughput acceleration coefficient using the throughput acceleration coefficient over multiple periods of time and provide machine-learned module 180 the statistical measurement of throughput acceleration coefficient. Examples of statistical measurement of throughput acceleration coefficient include, but are not limited to, an average throughput acceleration coefficient, a weighted-average throughput acceleration coefficient, and the like.

As described above, machine-learned module 180, using the implemented machine-learned model, generates a probability of failure value or score for data storage system 100 based on the provided set of parameter data, and/or, the throughput acceleration coefficient, and/or average drive writes per day of the data storage system 100. Machine-learned module 180 provides the probability of failure value to comparison module 190 included in controller 110. Comparison module 190 is configured to compare the probability of failure value to a threshold probability of failure value and determine whether the probability of failure value for data storage system 100 satisfies the threshold probability of failure value. Comparison module 190 is configured to generate an alert if the probability of failure value for data storage system 100 satisfies the threshold probability of failure value. In some implementations, the alert may be a binary signal, where a particular bit value (a high or a low bit value) indicates that the probability of failure value for data storage system 100 satisfies the threshold probability of failure value. In some implementations the alert may include the probability of failure value of data storage system 100.

Controller 110 provides the alert to host system 150. Based on the received alert, host system 150 determines whether to continue to store data in data storage system 100. In implementations where the alert provided to host system 150 includes the probability of failure value of data storage system 100, host system 150 may determine whether the probability of failure value is below a second threshold probability of failure value different from the probability of failure value used by the comparison module 180. In such implementations, if the probability of failure value of data storage system 100 is below or equals the second threshold probability of failure value, then host system 150 may continue to store data in data storage system 100.

Figure 2:
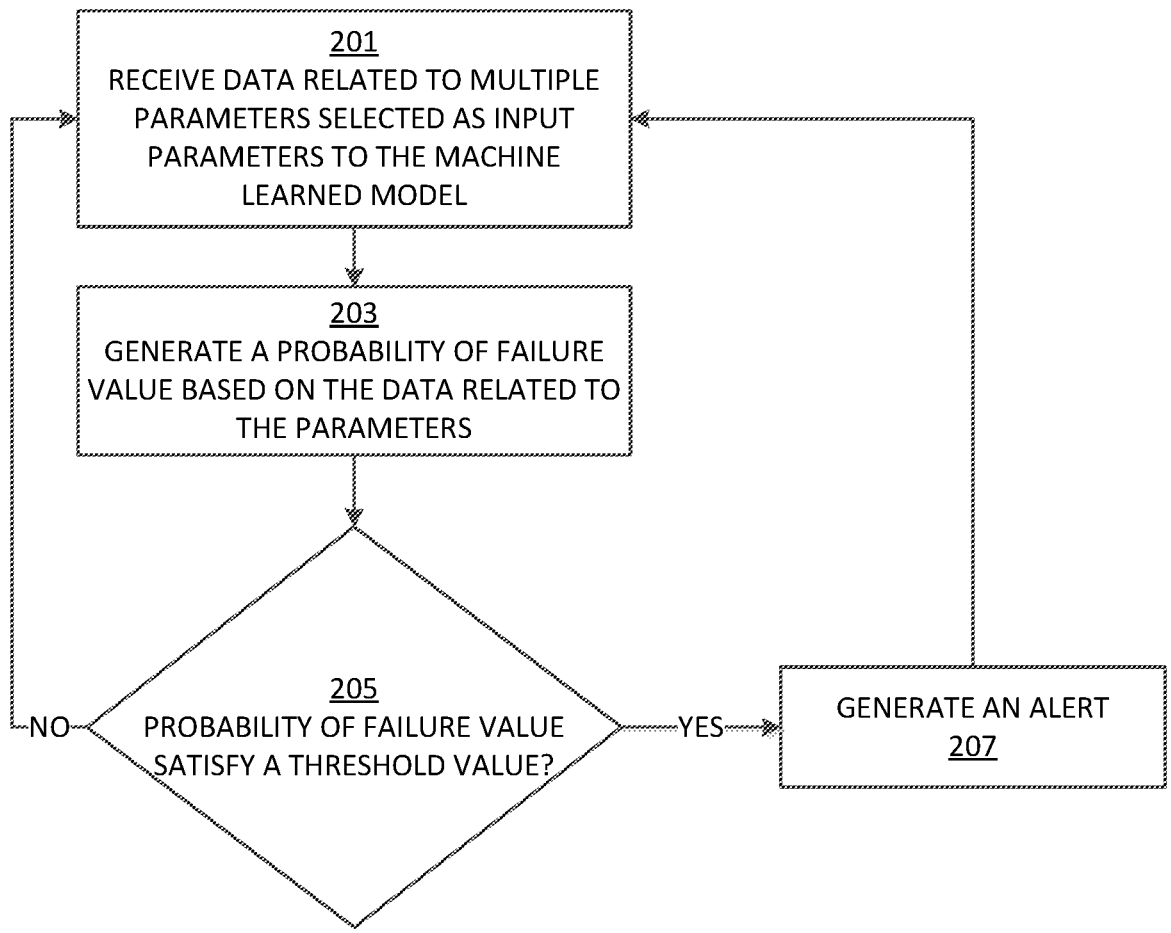
FIG. 2 is a flowchart illustrating a process of determining whether a solid-state storage drive will fail according to aspects of subject technology.

The above described process of predicting whether the data storage system 100 will fail and generating an alert according to aspects of subject technology is shown in the flowchart illustrated in FIG. 2. Data related to multiple parameters selected as inputs to the machine-learned model of the machine-learned module 180 are received by the machine-learned module 180 (block 201). As described above, the parameters selected as input parameters to the machine-learned model of the machine-learned module 180 are selected based on the parameters that the machine-learned model identified as being the most relevant in accurately predicting a failure of a data storage system by ranking the parameters. In some implementations, the controller 110 is configured to calculate, identify, and/or receive these parameter values and a sub-module of the controller 110 is configured to transmit the values in real-time or near-real time to the machine-learned module 180.

The machine-learned model of the machine-learned module 180, based on the data related to the multiple input parameters, generates a probability of failure value (block 203). The structure of the machine-learned model can be any supervised or unsupervised machine learning model. In some implementations, the machine-learned model can be designed based on machine learning models that are resistant to bias and variance. For example, the machine-learned model can be designed based on machine learning models such as Decision Trees, Logistic Regression, K-Nearest Neighbor and the like. The controller 110 is configured to determine whether the probability of failure value satisfies a threshold probability of failure value (block 205). As described above, a module of controller 110, the comparison module 190, is configured to compare the generated probability of failure value with the threshold probability of failure value, and generate either a first signal corresponding to the generated probability of failure value satisfying the threshold probability of failure value or a second signal corresponding to the generated probability of failure value not satisfying the threshold probability of failure value.

The controller 110, in response to the generated probability of failure value satisfying the threshold probability of failure value ("YES" at block 205), generates an alert for the host system 150 of the data storage system 100 (block 207). In some implementations, the signal output from the comparison module 190 can be transmitted directly to the host system 150 via host interface 140. In some implementations, based on the signal from the comparison module 190 indicating that the generated probability of failure value satisfies the threshold probability of failure value, the controller 110 transmits the generated probability of failure value to the host system 150. The process continues to the block 201 after generating the alert at block 207 and in response to the generated probability of failure value not satisfying the threshold probability of failure value ("NO" at block 205).

Figure 3:
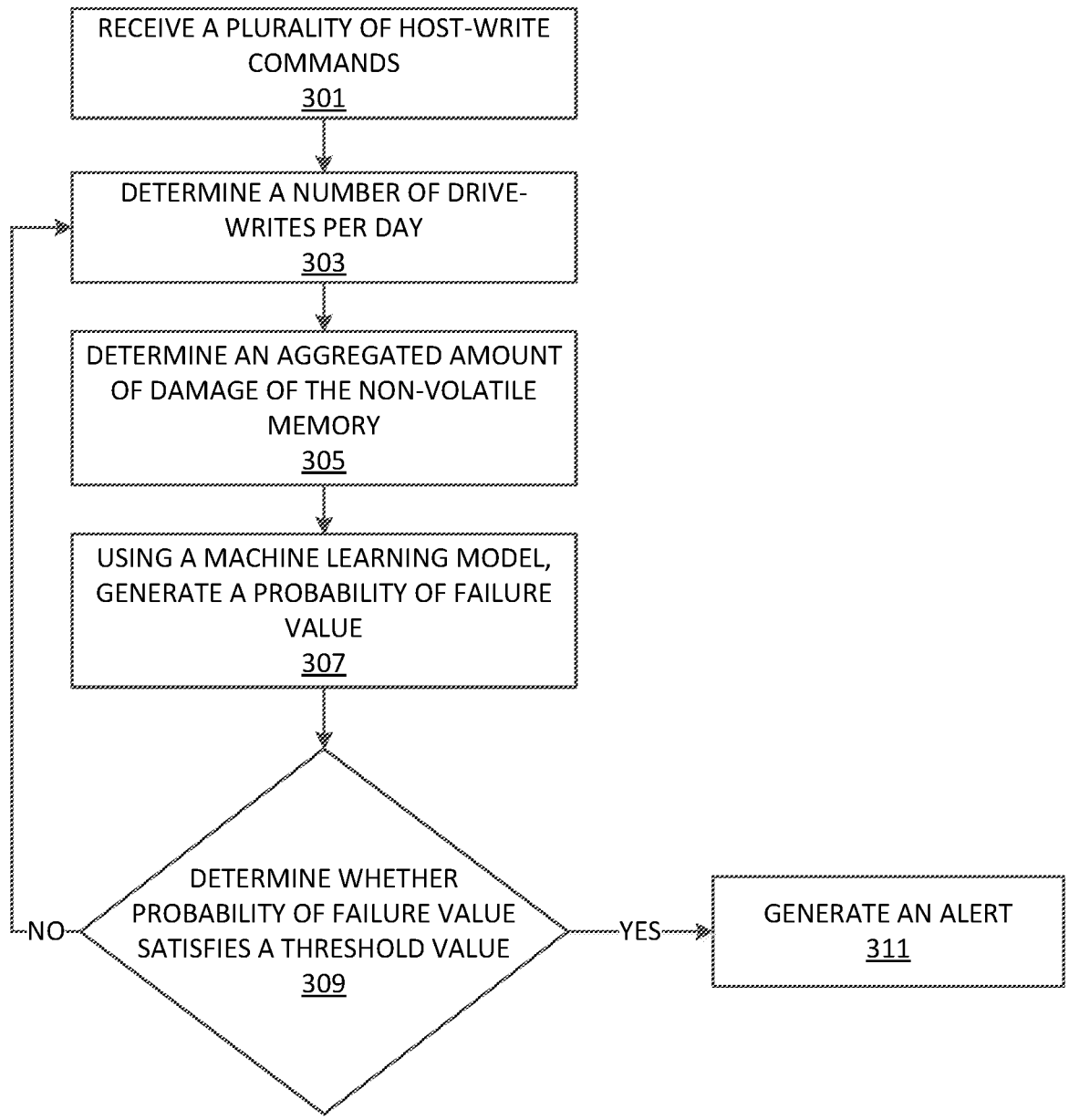
FIG. 3 is a flowchart illustrating a process of determining whether a solid-state storage drive will fail according to aspects of subject technology.

Turning now to FIG. 3, there is shown a flowchart for another embodiment of the above described process of predicting whether a data storage system, such as the data storage system 100, will fail and generating an alert according to aspects of subject technology. At data storage system 100, a plurality of host-write commands are received (block 301). Controller 110 determines a number of drive-writes per day based on the received plurality of host commands (block 303). Controller 110 determines an aggregated amount of damage of the non-volatile memory (block 305). As described above, examples of the aggregated amount of damage of the non-volatile memory include, but are not limited to, average drive writes per day from the time the data storage system 100 has been powered on, a throughput acceleration coefficient based on the host-driven number of drive-writes per day and the designed, pre-determined number of drive-writes per day. Using the machine-learned model implemented in machine-learned module 180, controller 110 generates a probability of failure value based on a set of parameter data and the throughput acceleration coefficient (block 307). Controller 110, using the comparison module 190, determines whether probability of failure value satisfies a threshold probability of failure value (block 309). If the probability of failure value satisfies a threshold probability of failure value, then the controller 110, using the comparison module 190, generates an alert (block 311).

Thus, the subject technology provides predictive health and reliability assessment of high performance and highly reliable solid-state storage memory sub-system of SSDs under throughput acceleration based on parametric data, while leveraging a multivariable statistical learning technique.

Many of the above-described features of example process and related features and applications, may be implemented as software or firmware processes that are specified as a set of instructions recorded on a processor-readable storage medium (also referred to as computer-readable medium). When these instructions are executed by one or more processing unit(s) (e.g., one or more processors, cores of processors, or other processing units), the processing unit(s) are caused to perform the actions indicated in the instructions. Examples of processor-readable media include, but are not limited to, volatile memory 120, non-volatile memory 130, as well as other forms of media such as magnetic media, optical media, and electronic media. The processor-readable media does not include carrier waves and electronic signals communicated wirelessly or over wired connections.

The term "software" is meant to include, where appropriate, firmware residing in memory or applications stored in memory, which may be read into a working memory for processing by a processor. Also, in some implementations, multiple software aspects of the subject disclosure may be implemented as sub-parts of a larger program while remaining distinct software aspects of the subject disclosure. In some implementations, multiple software aspects may also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code).

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject disclosure, and the subject disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the subject disclosure or that such aspect applies to all configurations of the subject disclosure. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the subject disclosure or that such implementation applies to all configurations of the subject disclosure. A disclosure relating to an implementation may apply to all aspects, or one or more aspects. An implementation may provide one or more examples. A phrase such as an "implementation" may refer to one or more implementations and vice versa. A phrase such as a "configuration" does not imply that such configuration is essential to the subject disclosure or that such configuration applies to all configurations of the subject disclosure. A disclosure relating to a configuration may apply to all configurations, or one or more configurations. A configuration may provide one or more examples. A phrase such as a "configuration" may refer to one or more configurations and vice versa.

The word "exemplary" is used to mean "serving as an example or illustration." Any aspect or design described herein as "exemplary" is not necessarily to be construed as preferred or advantageous over other aspects or designs.

What is claimed is:

1. A method comprising:
identifying combinations of input parameter values of a machine-learned model, the combinations capable of resulting in a non-volatile memory component failure;
ranking a set of parameters of the machine-learned model between a high ranking and a low ranking, the ranking associated with the identifying;
selecting, from the set of parameters, a plurality of input parameters for the machine-learned model based on the ranking;
generating or modifying a set of weights to apply to input parameter values based on the ranking;
receiving a plurality of host-write commands at a solid-state storage device;
calculating, based on the plurality of host-write commands, a number of drive-writes per day;
calculating, based on the number of drive-writes per day, an aggregated amount of degradation to a non-volatile memory component of the solid-state storage device;
generating, using the machine-learned model, a probability of failure value based on data associated with the plurality of input parameters for the machine-learned model and the aggregated amount of degradation to the non-volatile memory component of the solid-state storage device; and
generating, based on the probability of failure value, an alert,
wherein:
the set of parameters comprises the plurality of input parameters for the machine-learned model;
the aggregated amount of degradation to the non-volatile memory component comprises a throughput acceleration coefficient;
the throughput acceleration coefficient is determined by dividing the number of drive-writes per day by a drive-writes per day specification;
the number of drive-writes per day is determined based on the plurality of host-write commands, a total amount of data written to the non-volatile memory component, and a data storage capacity of the non-volatile memory component;
the drive-writes per day specification is a pre-determined number of drive-writes per day for the non-volatile memory component to handle in order for the solid-state storage device to operate for a specific period of time; and
the solid-state storage device is configured to store the drive-writes per day specification.

2. The method of claim 1, wherein the alert is generated in response to the probability of failure value satisfying a threshold probability of failure value.

3. The method of claim 1, wherein the aggregated amount of degradation to the non-volatile memory component comprises average drive-writes per day over a lifetime of the non-volatile memory component.

4. The method of claim 1, wherein the machine-learned model is implemented within a firmware of the solid-state storage device.

5. The method of claim 1, wherein the data associated with the plurality of input parameters comprises:
non-volatile memory translation layer management events data;
controller initiated data movement for non-volatile memory endurance management event data;
non-volatile memory defect density data;
controller initiated data movement in non-volatile memory event data;
controller initiated data movement in non-volatile memory for managing defragmentation of the non-volatile memory event data;
non-volatile memory bit error rate data;
controller initiated non-volatile memory erase or rewrite operation management data; and
controller initiated event for non-volatile memory data movement and correction in response to errors data.

6. The method of claim 1,
wherein the selecting comprises selecting the plurality of input parameters for the machine-learned model having the high ranking,
wherein the machine-learned model is trained using training data from a population of data storage systems,
wherein the population of data storage systems includes a first set of data storage systems that has failed and a second set of data storage systems that has not failed, and
wherein the training data comprises data related to the first set of data storage systems from a first time stress is applied to the first set of data storage systems until the first set of data storage systems has failed.

7. The method of claim 6,
wherein the machine-learned model is trained using a unseen data set,
wherein the unseen data set is data from a third set of data storage systems,
wherein the third set of data storage systems is different from the first set of data storage systems and the second set of data storage systems,
wherein the unseen data set is provided to the machine-learned model in a same order of time as the unseen data set is generated, and
wherein the unseen data set is provided to the machine-learned model from a first instance of time that the unseen data set is generated until a last instance of time that the unseen data set is generated.

8. A solid-state storage device, comprising:
a controller;
a non-volatile memory component;
the controller configured to:
receive a plurality of host-write commands;
calculate, based on the plurality of host-write commands, a number of drive-writes per day;
calculate, based on the number of drive-writes per day, an aggregated amount of degradation to the non-volatile memory component;
generate, using a machine-learned model, a probability of failure value based on data associated with a plurality of input parameters for the machine-learned model and the aggregated amount of degradation to the non-volatile memory component; and
generate, based on the probability of failure value, an alert,
wherein the machine-learned model is associated with the following operations:
identifying combinations of input parameter values of a machine-learned model, the combinations capable of resulting in a non-volatile memory component failure;
ranking a set of parameters of the machine-learned model between a high ranking and a low ranking, the ranking associated with the identifying;

selecting, from the set of parameters, the plurality of input parameters for the machine-learned model based on the ranking; and
generating or modifying a set of weights to apply to input parameter values based on the ranking,
wherein the set of parameters comprises the plurality of input parameters for the machine-learned model, and
wherein the data associated with the plurality of input parameters comprises:
non-volatile memory translation layer management events data;
controller initiated data movement for non-volatile memory endurance management event data;
non-volatile memory defect density data;
controller initiated data movement in non-volatile memory event data;
controller initiated data movement in non-volatile memory for managing defragmentation of the non-volatile memory event data;
non-volatile memory bit error rate data;
controller initiated non-volatile memory erase or rewrite operation management data; and
controller initiated event for non-volatile memory data movement and correction in response to errors data.

9. The solid-state storage device of claim 8, wherein the alert is generated based on the probability of failure value satisfying a threshold probability of failure value.

10. The solid-state storage device of claim 8, wherein one or more parameters of the plurality of input parameters comprise output data from a proactive firmware algorithm.

11. The solid-state storage device of claim 8, wherein one or more parameters of the plurality of input parameters comprise output data from a reactive firmware algorithm.

12. The solid-state storage device of claim 8, wherein the aggregated amount of degradation to the non-volatile memory component is based on an average drive-writes over a lifetime of the non-volatile memory component.

13. The solid-state storage device of claim 8, wherein the aggregated amount of degradation to the non-volatile memory component is based on a throughput acceleration coefficient of the non-volatility memory component,
wherein the controller is configured to determine the throughput acceleration coefficient by dividing the number of drive-writes per day by a drive-writes per day specification,
wherein the controller is configured to determine the number of drive-writes per day based on the plurality of host-write commands, a total amount of data written to the non-volatile memory component, and a data storage capacity of the non-volatile memory component,
wherein the drive-writes per day specification is a pre-determined number of drive-writes per day for the non-volatile memory component to handle in order for the solid-state storage device to operate for a specific period of time, and
wherein the solid-state storage device is configured to store the drive-writes per day specification.

14. The solid-state storage device of claim 8, wherein the machine-learned model is based on a random decision forest, and
wherein the machine-learned model is implemented as a kernel within the solid-state storage device.

15. The solid-state storage device of claim 8,
wherein the selecting comprises selecting the plurality of input parameters for the machine-learned model having the high ranking,
wherein the machine-learned model is associated with training using training data from a population of data storage systems,
wherein the population of data storage systems includes a first set of data storage systems that has failed and a second set of data storage systems that has not failed, and
wherein the training data comprises data related to the first set of data storage systems from a first time stress is applied to the first set of data storage systems until the first set of data storage systems has failed.

16. The solid-state storage device of claim 15,
wherein the machine-learned model is associated with training using a unseen data set,
wherein the unseen data set is data from a third set of data storage systems,
wherein the third set of data storage systems is different from the first set of data storage systems and the second set of data storage systems,
wherein when the unseen data set is provided to the machine-learned model, the unseen data set is provided in a same order of time as the unseen data set is generated, and
wherein when the unseen data set is provided to the machine-learned model, the unseen data set is provided from a first instance of time that the unseen data set is generated until a last instance of time that the unseen data set is generated.

17. A solid-state storage device, comprising:
a non-volatile memory component;
means for receiving a plurality of host-write commands at a solid-state storage device;
means for calculating, based on the plurality of host-write commands, a number of drive-writes per day;
means for calculating, based on the number of drive-writes per day, an aggregated amount of degradation to the non-volatile memory component;
means for generating, using a machine-learned model, a probability of failure value based on data associated with a plurality of input parameters for the machine-learned model and the aggregated amount of degradation to the non-volatile memory component; and
means for generating, based on the probability of failure value, an alert,
wherein the machine-learned model is associated with the following operations:
identifying combinations of input parameter values of a machine-learned model, the combinations capable of resulting in a non-volatile memory component failure;
ranking a set of parameters of the machine-learned model between a high ranking and a low ranking, the ranking associated with the identifying;
selecting, from the set of parameters, the plurality of input parameters for the machine-learned model based on the ranking; and
generating or modifying a set of weights to apply to input parameter values based on the ranking,
wherein the set of parameters comprises the plurality of input parameters for the machine-learned model,
wherein the aggregated amount of degradation to the non-volatile memory component comprises a throughput acceleration coefficient,
wherein the throughput acceleration coefficient is determined by dividing the number of drive-writes per day by a drive-writes per day specification, wherein the number of drive-writes per day is determined based on the plurality of host-write commands, a total amount of data written to the non-volatile memory component, and a data storage capacity of the non-volatile memory component, wherein the drive-writes per day specification is a pre-determined number of drive-writes per day for the non-volatile memory component to handle in order for the solid-state storage device to operate for a specific period of time, and wherein the solid-state storage device is configured to store the drive-writes per day specification.

18. The solid-state storage device of claim 17, wherein the machine-learned model is implemented as a module within a firmware of the solid-state storage device.

19. The solid-state storage device of claim 17, wherein the data associated with the plurality of input parameters comprises:

non-volatile memory translation layer management events data;

controller initiated data movement for non-volatile memory endurance management event data;

non-volatile memory defect density data;

controller initiated data movement in non-volatile memory event data;

controller initiated data movement in non-volatile memory for managing defragmentation of the non-volatile memory event data;

non-volatile memory bit error rate data;

controller initiated non-volatile memory erase or rewrite operation management data; and controller initiated event for non-volatile memory data movement and correction in response to errors data.

20. The solid-state storage device of claim 17, wherein the selecting comprises selecting the plurality of input parameters for the machine-learned model having the high ranking, wherein the machine-learned model is associated with training using training data from a population of data storage systems, wherein the population of data storage systems includes a first set of data storage systems that has failed and a second set of data storage systems that has not failed, and wherein the training data comprises data related to the first set of data storage systems from a first time stress is applied to the first set of data storage systems until the first set of data storage systems has failed.

* * * * *